(12) United States Patent
Arai

(10) Patent No.: US 9,058,998 B2
(45) Date of Patent: Jun. 16, 2015

(54) SEMICONDUCTOR INTEGRATED CIRCUIT

(71) Applicant: ROHM CO., LTD., Kyoto (JP)

(72) Inventor: Kenji Arai, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/293,349

(22) Filed: Jun. 2, 2014

(65) Prior Publication Data

US 2014/0361372 A1    Dec. 11, 2014

(51) Int. Cl.
*H01L 23/60* (2006.01)
*H01L 27/02* (2006.01)

(52) U.S. Cl.
CPC ........ *H01L 27/0288* (2013.01); *H01L 27/0266* (2013.01); *H01L 27/0285* (2013.01)

(58) Field of Classification Search
CPC ............ H01L 27/0285; H01L 27/0266; H01L 27/0288
See application file for complete search history.

(56) References Cited

U.S. PATENT DOCUMENTS

| | | | |
|---|---|---|---|
| 5,565,790 A * | 10/1996 | Lee .................................. | 326/30 |
| 2001/0006243 A1* | 7/2001 | Morishita ...................... | 257/360 |
| 2001/0012189 A1* | 8/2001 | Tang ................................ | 361/56 |
| 2002/0033506 A1* | 3/2002 | Morishita ...................... | 257/355 |
| 2003/0094969 A1* | 5/2003 | Tatehara et al. ................. | 326/24 |
| 2008/0151446 A1* | 6/2008 | Ker et al. ......................... | 361/56 |
| 2009/0261417 A1* | 10/2009 | Jou et al. ........................ | 257/355 |
| 2012/0154963 A1* | 6/2012 | Deval et al. ..................... | 361/56 |

FOREIGN PATENT DOCUMENTS

JP       2005-252123 A       9/2005

* cited by examiner

*Primary Examiner* — Steven J Fulk
(74) *Attorney, Agent, or Firm* — Cantor Colburn LLP

(57) ABSTRACT

An input signal having a high level or a low level is input to a pad. A first protection element includes a first transistor configured as an N-channel MOSFET designed so as to withstand ESD. A second protection element includes a second transistor configured as a P-channel MOSFET designed so as to withstand ESD. A capacitance element is connected to a second line, and forms an RC filter together with a filter resistor. The capacitance element includes at least one from among a third transistor having the same device structure as that of the first transistor and a fourth transistor having the same device structure as that of the second transistor.

16 Claims, 7 Drawing Sheets

SEMICONDUCTOR INTEGRATED CIRCUIT

BACKGROUND OF THE INVENTION

1. Field of the Invention

The present invention relates to a semiconductor integrated circuit.

2. Description of the Related Art

In order to suppress a malfunction of a semiconductor integrated circuit due to electrostatic discharge or other kinds of noise (which is also referred to as "EMI: Electro-Magnetic Interference") received from a human body or from another device, various countermeasures have been proposed for products mounting such a semiconductor integrated circuit. Such countermeasures can be roughly classified into two types: for example, one is that such a countermeasure is provided to a portion that differs from the semiconductor integrated circuit, e.g., is provided to a housing of the product, internal wiring, or the like; and the other is that such a countermeasure is provided to the semiconductor integrated circuit itself. In recent years, there is an increased demand for a semiconductor integrated circuit having improved EMS (Electro-Magnetic Susceptibility).

For example, Patent Document 1 (Japanese Patent Application Laid Open No. 2005-252123) discloses a technique for employing an RC filter to remove noise contaminating a semiconductor integrated circuit. In this technique, a first semiconductor chip that corresponds to a semiconductor integrated circuit to be protected and a second semiconductor chip on which an RC filter is formed are provided in a layered structure. With such an arrangement, an external signal is input to the semiconductor integrated circuit formed on the first semiconductor chip via the RC filter formed on the second chip.

However, with such a configuration disclosed in Patent Document 1, the RC filter is not capable of effectively removing noise directly contaminating a pad formed on the first semiconductor chip configured as a semiconductor integrated circuit. Furthermore, such an arrangement requires an additional chip used to mount the RC filter. This leads to an increased parts cost and a higher assembly cost.

SUMMARY OF THE INVENTION

The present invention has been made in order to solve such a problem. Accordingly, it is an exemplary purpose of an embodiment of the present invention to provide a semiconductor integrated circuit having improved EMS with a low cost.

An embodiment of the present invention relates to a semiconductor integrated circuit. The semiconductor integrated circuit comprises: a pad connected to receive an input signal having a high level or otherwise a low level; an internal circuit; a power supply line; a ground line; a filter resistor; a protection resistor; a first line that connects a first terminal of the filter resistor and the pad; a second line that connects a second terminal of the filter resistor and a first terminal of the protection resistor; a third line that connects a second terminal of the protection resistor and the internal circuit; a first protection element including a first transistor configured as an N-channel MOSFET (Metal Oxide Semiconductor Field Effect Transistor) designed so as to withstand ESD, arranged such that its drain is connected to the first line, and its source, its gate, and its back gate are connected to the ground line; a second protection element including a second transistor configured as a P-channel MOSFET designed so as to withstand ESD, arranged such that its drain is connected to the first line, and its source, its gate, and its back gate are connected to the power supply line; and a capacitance element coupled to the second line so as to form an RC filter together with the filter resistor, wherein the capacitance element includes at least one of a third transistor and a fourth transistor, and the third transistor is configured as an N-channel MOSFET having the same device structure as that of the first transistor, and the fourth transistor is configured as a P-channel MOSFET having the same device structure as that of the second transistor.

The present inventor has focused on a layout in which a protection element used as an ESD countermeasure is arranged in the vicinity of the pad. It should be noted that the capacitance may be configured as a transistor of the same type as the protection element. With such an embodiment, by forming an RC filter using the ESD protection element in the semiconductor substrate, such an arrangement is capable of reducing the effect of noise on the internal circuit with a low cost. Typically, such an RC filter integrated in the semiconductor integrated circuit is also required to have ESD tolerance. With such an arrangement, the first and second protection elements are arranged as the upstream stage of the RC filter. In addition, the RC filter itself is configured using an ESD protection element, thereby providing improved reliability of the RC filter.

Also, a set of the first transistor, the second transistor, and the filter resistor, and a set of the third transistor, the fourth transistor, and the protection resistor, may each be configured as a standard cell including an N-channel MOSFET, a P-channel MOSFET, and a resistor device, arranged in a predetermined manner.

In the design stage for the semiconductor integrated circuit, multiple standard cells are arranged beforehand in the vicinity of the pad which is required to have EMS. Subsequently, the metal wiring that connects the elements arranged in each standard cell is designed according to the usage and the specifications of the semiconductor integrated circuit. This provides an optimum input/output circuit for the semiconductor integrated circuit.

Also, the P-channel MOSFET and the N-channel MOSFET may each comprise multiple transistor elements, and may each be configured to allow design modification of the transistor size to be made by changing metal wiring that connects the multiple transistor elements.

In particular, the sizes of the third and fourth transistors correspond to the capacitance value of the capacitance element of the RC filter. Such an embodiment allows the time constant of the RC filter to be designed so as to satisfy the EMS specifications and the semiconductor integrated circuit specifications.

Also, the resistor device may comprise multiple resistor elements, and may be configured to allow design modification of the resistance value to be made by changing metal wiring.

Such an embodiment allows the time constant of the RC filter to be designed so as to satisfy the EMS specifications and the semiconductor integrated circuit specifications.

Also, the standard cell may be arranged adjacent to the pad in an I/O region positioned in an outer circumference of a circuit area in which the internal circuit is arranged.

Also, multiple standard cells may be arranged along an edge of a semiconductor substrate. Also, the N-channel MOSFET, the P-channel MOSFET, and the resistor device included in each one of the standard cells may be laid out in a direction that is orthogonal to the aforementioned edge.

Also, the ground line may be formed along the aforementioned edge such that it overlaps the multiple N-channel MOSFETs included in the multiple standard cells. Also, the power supply line may be formed along the aforementioned edge such that it overlaps the multiple P-channel MOSFETs included in the multiple standard cells.

Such an embodiment provides an efficient layout.

Also, the input signal may be configured to have an edge in response to which the internal circuit operates. Also, the input signal may be configured as any one from among a clock signal, a power-on reset signal, and a test signal.

Also, the semiconductor integrated circuit may further comprise an output buffer configured to allow the internal circuit to output a signal via the pad. Also, the output buffer may comprise: a fifth transistor having the same device structure as that of the first transistor, and arranged such that its drain is connected to the first line, its source and its back gate are connected to the ground line, and a signal output from the internal circuit is input to its gate; and a sixth transistor having the same device structure as that of the second transistor, and arranged such that its drain is connected to the first line, its source and its back gate are connected to the power supply line, and a signal output from the internal circuit is input to its gate.

Such an embodiment allows the fifth transistor and the sixth transistor that form the output buffer to function as a path which allows ESD surge to be released, as with the first transistor and the second transistor.

Also, a set of the first transistor, the second transistor, and the filter resistor, and a set of the third transistor, the fourth transistor, and the protection resistor may each be configured as a standard cell comprising an N-channel MOSFET, a P-channel MOSFET, and a resistor device, arranged in a predetermined manner. Also, the fifth transistor and the sixth transistor may each be formed in the standard cell that corresponds to the set of the first transistor, the second transistor, and the filter resistor.

Also, a part of the second line may be configured to have an effective inductance. Such an embodiment provides an RCL filter, which allows the filter pass band, delay time, and phase characteristics to be designed in a flexible manner as compared with an RC filter.

Also, the capacitance element may be configured using a PN junction capacitance of at least one from among the third transistor and the fourth transistor.

Also, the capacitance element may be configured using a gate capacitance of at least one from among the third transistor and the fourth transistor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
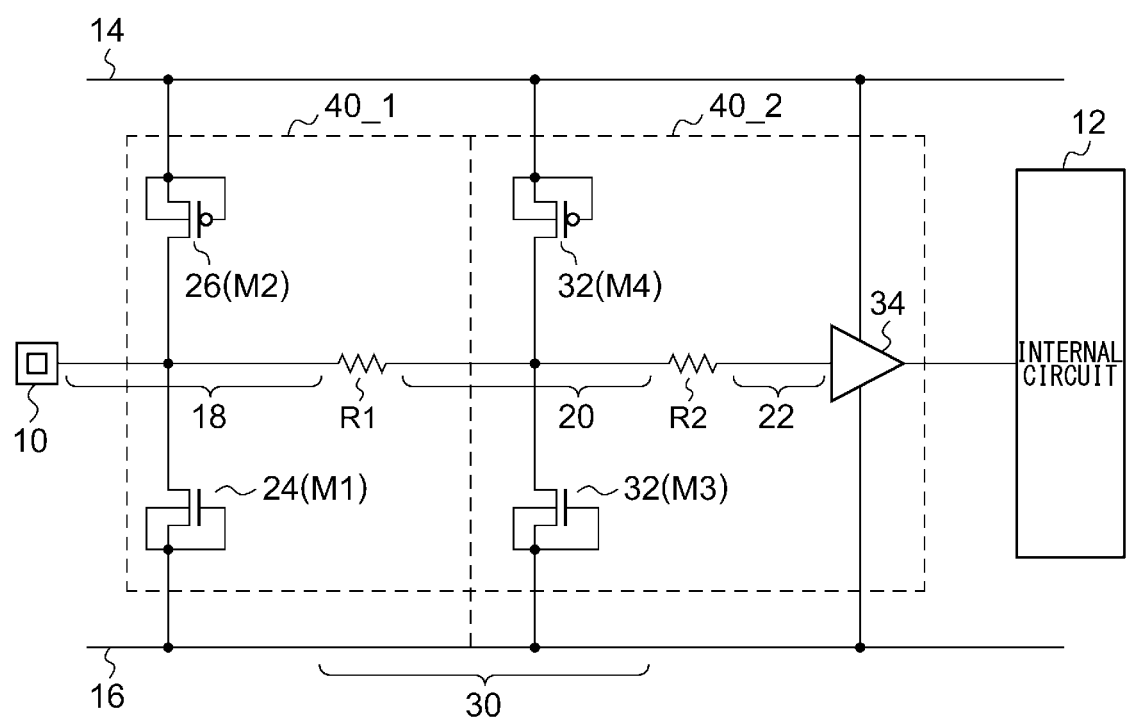
FIG. 1 is a circuit diagram showing a semiconductor integrated circuit according to an embodiment.

FIG. 1 is a circuit diagram showing a semiconductor integrated circuit 2 according to an embodiment.

The semiconductor integrated circuit 2 includes a pad 10, an internal circuit 12, a power supply line 14, a ground line 16, a filter resistor R1, a protection resistor R2, a first line 18, a second line 20, a third line 22, a first protection element 24, a second protection element 26, a capacitance element 32, and an input circuit 34.

The pad 10 receives an external input signal having a high level or low level. The input signal has an edge and the internal circuit 12 operates in response to the edge of the input signal. Examples of such an input signal include a clock signal, a power-on reset signal, a test signal, and the like.

The first line 18 connects the first terminal of the filter resistor R1 and the pad 10. The second line 20 connects the second terminal of the filter resistor R1 and the first terminal of the protection resistor R2. The third line 22 connects the second terminal of the protection resistor R2 and the internal circuit 12. The input circuit 34 is arranged on a path of the third line 22 between the protection resistor R2 and the internal circuit 12. It should be noted that the input circuit 34 may be built into the internal circuit 12.

The first protection element 24 includes a first transistor M1 configured as an N-channel MOSFET. The first transistor M1 is designed so as to withstand ESD. Such an ESD protective transistor is also referred to as the "ESD protection element". The drain of the first transistor M1 is connected to the first line 18. Furthermore, the source, gate, and back gate of the first transistor M1 are connected to the ground line 16.

The second protection element 26 includes a second transistor M2 configured as a P-channel MOSFET. The second transistor M2 is also designed so as to withstand ESD in the same way as the first transistor M1. That is to say, the second transistor M2 is configured as an ESD protection element. The drain of the second transistor M2 is connected to the first line 18. The source, gate, and back gate of the second transistor M2 are connected to the power supply line 14.

The capacitance element 32 is connected to the second line 20, and forms an RC filter 30 together with the filter resistor R1. The capacitance element 32 includes at least one of a third transistor M3 and a fourth transistor M4. The third transistor M3 is configured as an N-channel MOSFET having the same device structure as that of the first transistor M1. The fourth transistor M4 is configured as a P-channel MOSFET having the same device structure as that of the second transistor M2.

FIG. 1 shows an arrangement in which the capacitance element 32 includes both the third transistor M3 and the fourth transistor M4. The capacitance element 32 shown in FIG. 1 is configured using the PN junction capacitance of the third transistor M3 and the fourth transistor M4. Specifically, the gate, back gate, and source of the third transistor M3 are connected to the ground line 16. The gate, back gate, and source of the fourth transistor M4 are connected to the power supply line 14.

Figure 2A:
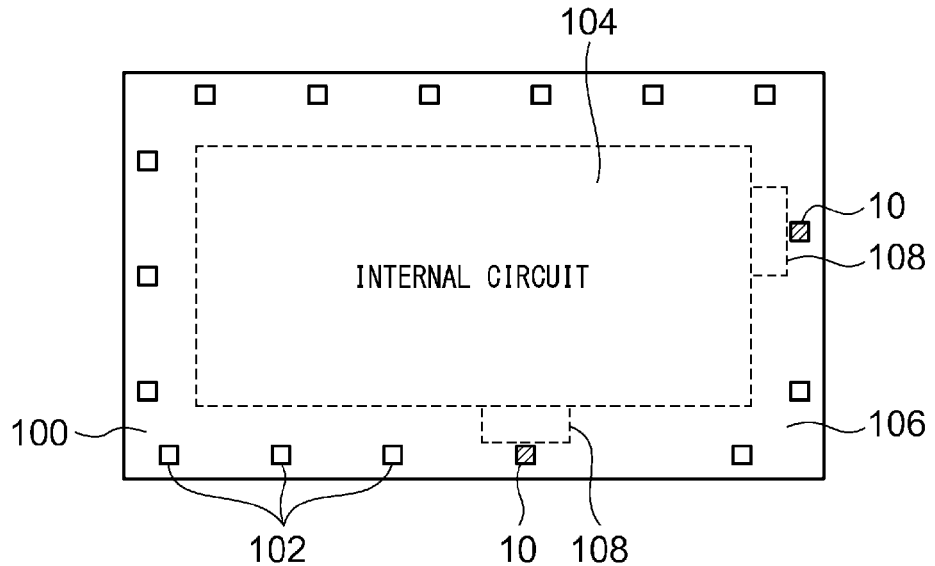
FIGS. 2A and 2B are layout diagrams each showing the semiconductor integrated circuit.
Figure 2B:
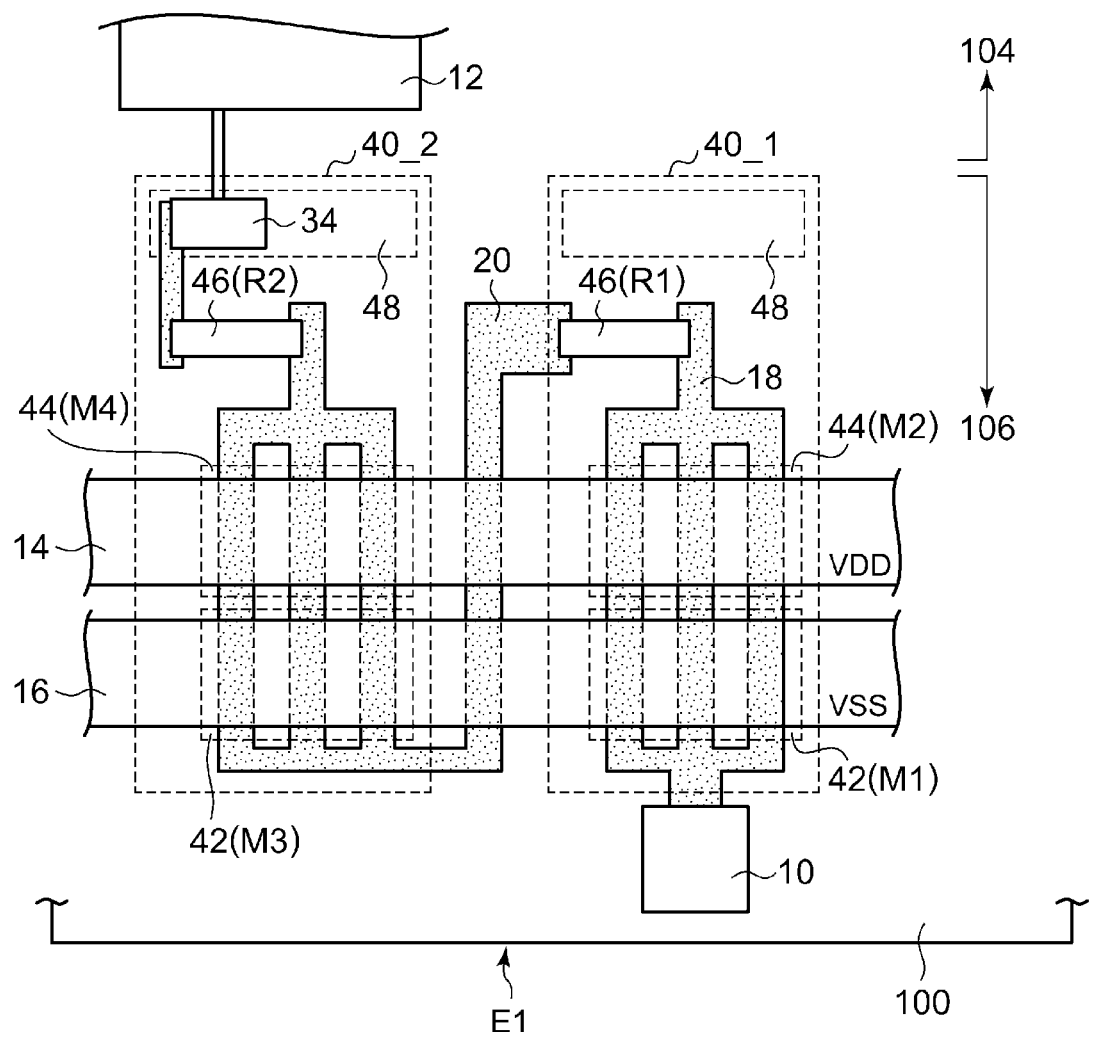

FIGS. 2A and 2B are layout diagrams each showing a layout of the semiconductor integrated circuit 2. FIG. 2A shows the overall configuration of the semiconductor integrated circuit 2. The semiconductor integrated circuit 2 is integrated on a semiconductor substrate 100. An internal circuit is formed in a circuit region 104 of a central portion of the semiconductor substrate 100. Furthermore, multiple pads 102 are formed in an I/O region 106 arranged outside the circuit region 104.

The pad 10 that requires improved EMS among the multiple pads 102 is represented as a hatched area in the drawing. An input/output circuit 108 including the RC filter 30 and the like connected to the pad 10 is formed in the I/O region 106 in the vicinity of the pad 10.

A set of the first transistor M1, the second transistor M2, and the filter resistor R1 is configured as a standard cell 40_1, and a set of the third transistor M3, the fourth transistor M4, and the protection resistor R2 is configured as a standard cell 40_2.

FIG. 2B shows a layout of a portion of the semiconductor integrated circuit 2 in the vicinity of the pad 10. This layout diagram shows only main wiring and components. The standard cells 40_1 and 40_2 each include an N-channel MOSFET 42, a P-channel MOSFET 44, and a resistor device 46, arranged in a predetermined layout. In the present embodiment, each standard cell 40 further includes a transistor element 48 so as to form the input circuit 34.

The first transistor M1, the second transistor M2, and the filter resistor R1 are configured using the N-channel MOSFET 42, the P-channel MOSFET 44, and the resistor device 46 of the standard cell 40_1.

The third transistor M3, the fourth transistor M4, and the protection resistor R2 are configured using the N-channel MOSFET 42, the P-channel MOSFET 44, and the resistor device 46 of the standard cell 40_2.

The multiple standard cells 40_1 and 40_2 are arranged in the vicinity of the pad 10 included in the I/O region 106 along an edge E1 of the semiconductor substrate 100. The N-channel MOSFET 42, the P-channel MOSFET 44, and the resistor device 46, included in each standard cell 40, are laid out along a direction that is orthogonal to the edge E1. The transistor element 48 that forms the input circuit 34 is arranged more toward the internal circuit side than is the protection resistor R2.

The ground line 16 is formed along the edge E1 such that it overlaps the multiple N-channel MOSFETs 42 included in the multiple standard cells 40_1 and 40_2. The power supply line 14 is formed along the edge E1 such that it overlaps the multiple P-channel MOSFETs 44 included in the multiple standard cells 40_1 and 40_2.

The N-channel MOSFET 42 and the P-channel MOSFET 44 may be mutually exchanged. In this case, preferably, the power supply line 14 and the ground line 16 may be mutually exchanged.

Figure 3A:
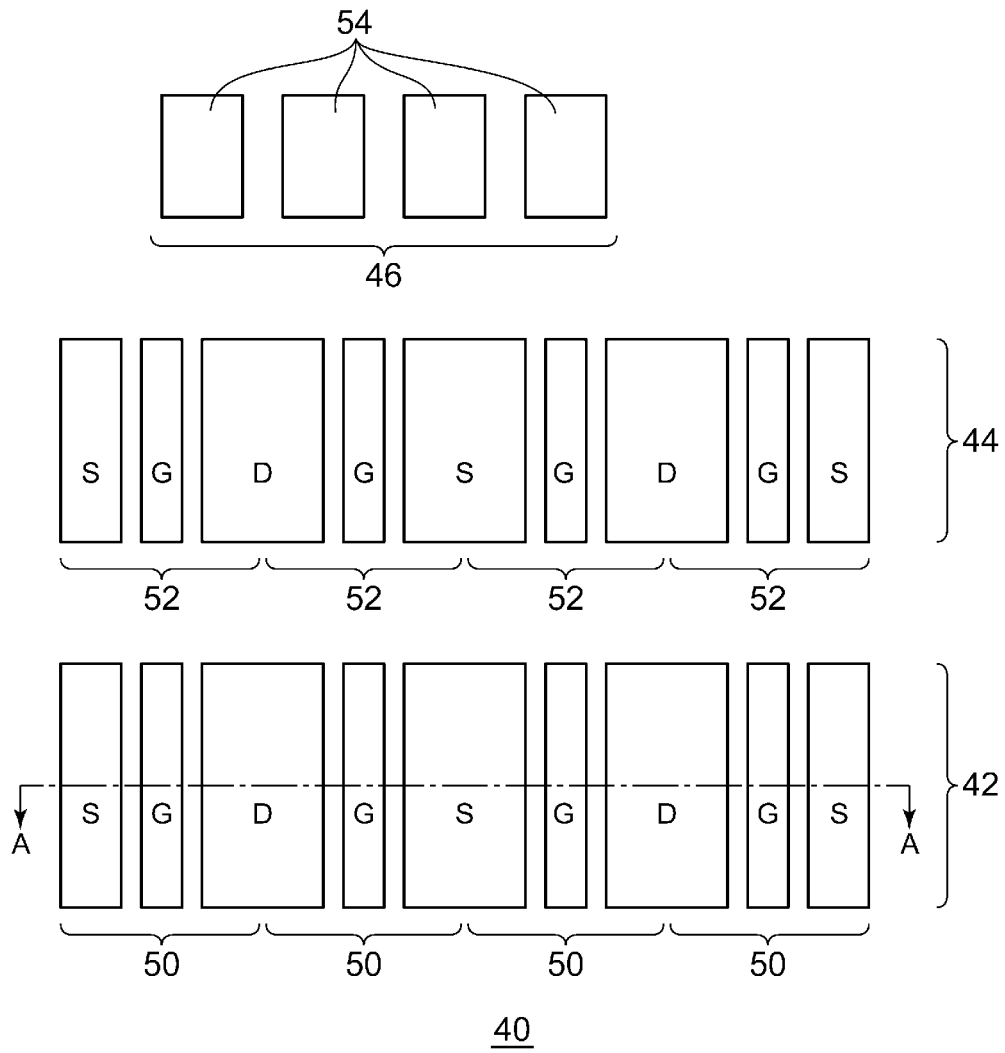
FIGS. 3A and 3B are diagrams each showing an example of the layout of a standard cell.
Figure 3B:
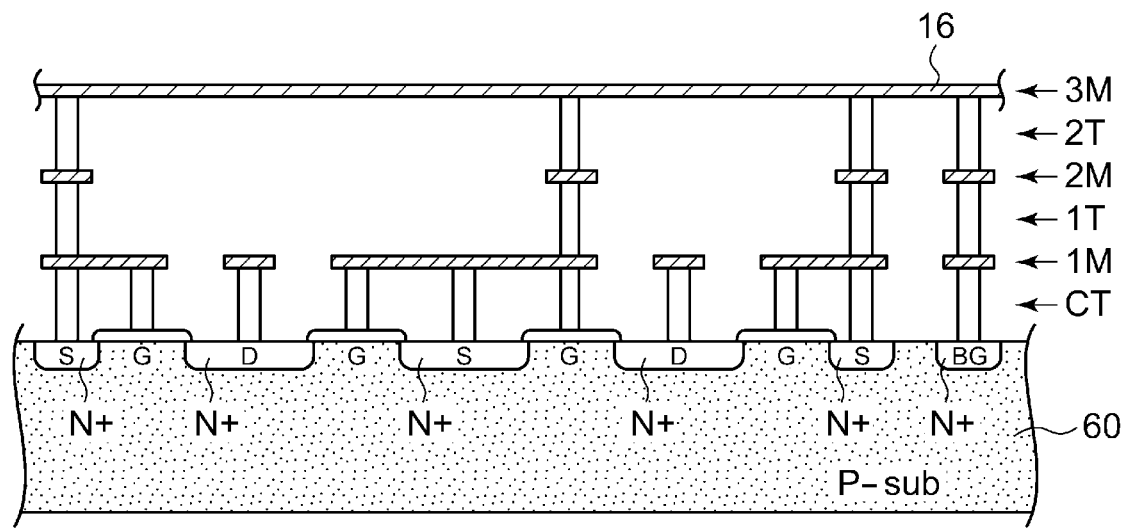

FIGS. 3A and 3B are diagrams each showing an example of the layout of the standard cell 40.

FIG. 3A is a plan view of the standard cell 40. The N-channel MOSFET 42 and the P-channel MOSFET 44 include a plurality of transistor elements 50 and a plurality of transistor elements 52, respectively. Design change is possible regarding the sizes of the N-channel MOSFET 42 and the P-channel MOSFET 44 according to the design of the metal wiring, via holes, and lands used to connect the multiple transistor elements 50.

The multiple transistor elements 50 and 52 are arranged along a direction in parallel with the edge E1 of the semiconductor substrate 100, for example. Also, the adjacent transistor elements 50 (52) may have a shared drain region or a shared source region.

Furthermore, the resistor device 46 includes multiple resistor elements 54. The resistor device 46 is configured by connecting necessary resistor elements selected from among the multiple resistor elements 54. That is to say, such an arrangement allows the design resistance value of the resistor device 46 to be changed by changing the design of the metal wiring.

FIG. 3B is a cross-sectional view taken along line A-A in FIG. 3A. The semiconductor integrated circuit 2 includes a P-type semiconductor layer 60, multiple wiring layers 1M through 3M formed on the P-type semiconductor layer 60, and contact holes CT and via holes (through holes) 1T and 2T configured to connect the wiring layers 1M through 3M and the semiconductor layer 60. The multiple transistor elements 50 are arranged in the horizontal direction. For example, directing attention to the standard cell 40_1, a necessary number of transistor elements 50 are selected from among the multiple transistor elements 50 according to the transistor size required for the first transistor M1. The aforementioned number of transistor elements 50 thus selected are arranged such that their drains are connected to the first line 18 (not shown in FIG. 3B) and such that their gates G, back gates BG, and sources S are each connected to the ground line 16. The source S, drain D, and back gate BG of each transistor element 50 are each configured as an N-type diffused layer N+.

The above is the configuration of the semiconductor integrated circuit 2. Next, description will be made regarding the operation thereof.

Returning to FIG. 1, in the actual operating state of the semiconductor integrated circuit 2, noise contamination can occur via the pad 10. Alternatively, let us consider an EMS test for the semiconductor integrated circuit 2 in which noise is applied to the power supply line or the ground line of a product mounting the semiconductor integrated circuit 2. In such a case, the pad 10 is contaminated by ESD surge noise.

A part of the large-amplitude component of the noise that has contaminated the pad 10 is released to the ground line 16 and the power supply line 14 via the first protection element 24 and the second protection element 26. Furthermore, a high-frequency component of the noise is input to the RC filter 30 via the first line 18. The high-frequency noise is removed by the RC filter 30. Thus, only the signal component that is originally required to reach the internal circuit 12 reaches the internal circuit 12. Thus, such an arrangement suppresses a malfunction due to noise.

The ESD-countermeasure protection elements 24 and 26 are arranged in the vicinity of the pad 10. Furthermore, transistors of the same types as those of the protection elements 24 and 26 are employed as the capacitance elements 32. Thus, with the semiconductor integrated circuit 2 according to the embodiment, by forming the RC filter 30 using the ESD protection elements on the semiconductor substrate 100, such an arrangement allows the noise effects on the internal circuit 12 to be reduced with a low cost.

In particular, as shown in FIGS. 2A and 2B, the standard cells 40_1 and 40_2 are formed in the I/O region 106. Thus, such an arrangement provides only a negligible increase in the chip area and a negligible increase in the cost required to configure the RC filter 30.

Typically, the RC filter integrated in the semiconductor integrated circuit also requires ESD tolerance. With such an arrangement, the first protection element 24 and the second protection element 26 are arranged as the upstream stage of the RC filter 30. In addition, the RC filter itself is configured using the ESD protection elements. Thus, such an arrangement provides improved reliability of the RC filter 30.

Here, the cutoff frequency (time constant) of the RC filter 30 is designed according to the frequency of the noise that contaminates the pad 10. Typically, the RC filter 30 is required to have a time constant of several ps, and the capacitance element 32 has a capacitance value of several pF. Thus, the filter resistor R1 is required to have a resistance value on the order of several kΩ. Thus, directing attention to the impedance as viewed from the pad 10 toward the internal circuit 12 side, the circuit that is arranged more toward the internal circuit 12 side than is the filter resistor R1 has a sufficiently high impedance. Thus, the capacitance element 32 has no effect on the input impedance of the semiconductor integrated circuit 2 as viewed from the pad 10. Thus, as viewed from the transmitter terminal of a circuit which transmits a signal to the semiconductor integrated circuit 2, the waveform dulling caused by the RC filter 30 is negligible. Thus, such an arrangement satisfies the signal waveform specifications.

As a tradeoff of the noise suppressing function, the RC filter 30 delays non-noise signal components of the input signal to be received by the internal circuit 12. Thus, in a case in which the time required to process the input signal and to output the signal thus processed is determined in the specifications of the semiconductor integrated circuit 2, in some cases, such an arrangement cannot satisfy the specifications due to the signal delay that occurs in the RC filter 30. That is to say, the time constant of the RC filter 30 must be designed giving consideration to the balance between the signal processing time required for the semiconductor integrated circuit 2 and the noise suppression effect. In some cases, the design must be changed by means of a trial and error approach. With the semiconductor integrated circuit 2 according to the embodiment, the input unit of the semiconductor integrated circuit 2 is configured as the standard cells 40_1 and 40_2. The capacitance value of the capacitance element 32 is determined according to the transistor size of the third transistor M3 or the fourth transistor M4. Thus, such an arrangement allows the capacitance value of the capacitance element 32 to be adjusted by modifying a mask for the wiring layer (and masks for a contact layer and a via hole layer) without a need to change the element layout. In the same way as shown in FIG. 3A, by configuring the resistor device 46 as multiple resistor elements 54, such an arrangement allows the resistance value of the filter resistor R1 to be adjusted by modifying a mask for the wiring layer (and masks for a contact layer and a via hole layer) without a need to change the element layout. That is to say, with the semiconductor integrated circuit 2 according to the embodiment, even if there is a need to change the design of the RC filter 30, it is sufficient to modify only the metal wiring layer (and the masks for the contact layer and the via hole layer), thereby providing a reduced cost.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Figure 4:
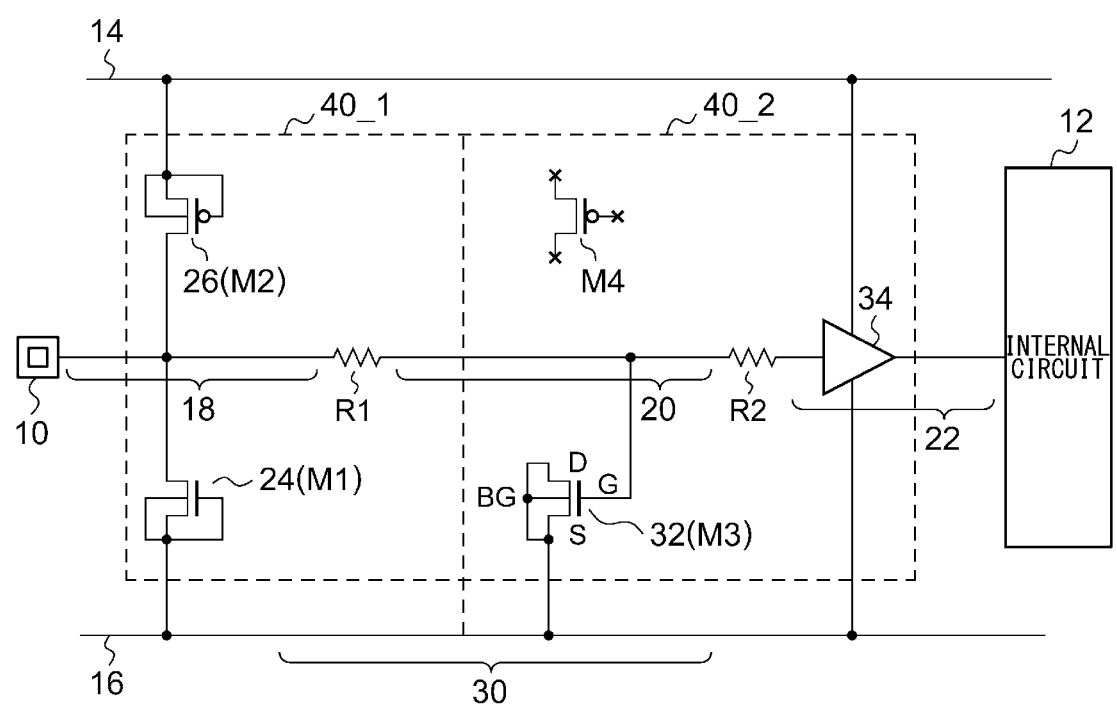
FIG. 4 is a circuit diagram showing a semiconductor integrated circuit according to a first modification.

FIG. 4 is a circuit diagram showing a semiconductor integrated circuit 2a according to a first modification. There are two notable points of difference between the semiconductor integrated circuit 2a and the semiconductor integrated circuit 2 shown in FIG. 1.

The first point of difference is that the capacitance element 32 is formed using the gate capacitance of the third transistor M3. Specifically, the gate of the third transistor M3 is connected to the second line 20. Furthermore, the back gate is connected to the ground line 16. The source and drain of the third transistor M3 are connected to the ground line 16, or otherwise are set to the open state.

The second point of difference is that only one transistor (M3 in this modification) selected from among the third transistor M3 and the fourth transistor M4 is used. In a case in which the semiconductor integrated circuit requires the capacitance element 32 to have only a small capacitance value, such an arrangement requires only one transistor.

With such an arrangement configured to use only one selected from among the third transistor M3 and the fourth transistor M4, the following advantage can be obtained. The transistor that forms the capacitance element 32 also operates as a surge protection element. Thus, when surge noise is input to the circuit, a current (which is also referred to as "surge current") flows through the transistor M3 or M4 that forms the capacitance element 32. It is needless to say that the surge current flows through the second line 20. With the semiconductor integrated circuit 2 shown in FIG. 1, surge current flows through two current paths of the third transistor M3 and the fourth transistor M4. In contrast, with the semiconductor integrated circuit 2a shown in FIG. 4, almost no current flows through the second line 20. Thus, with the semiconductor integrated circuit 2a, such an arrangement allows the surge current that flows through the second line 20 to be reduced. Thus, the second line 20 in the first modification is required to have only a small current capacity, as compared with the second line 20 of the semiconductor integrated circuit 2 shown in FIG. 1. This means that such an arrangement allows the second line 20 to be configured with thin wiring. This means that such an arrangement allows the second line 20 to be used as an inductance element.

It should be noted that each standard cell 40 itself may be configured in the same manner as shown in FIG. 2. In this case, the first modification requires only a modification of the metal wiring.

Second Modification

Description has been made in the embodiment regarding the semiconductor integrated circuit 2 configured to receive a signal from an external circuit. Description will be made regarding a semiconductor integrated circuit 2b according to a second modification configured to input and output a signal via a pad 10.

Figure 5:
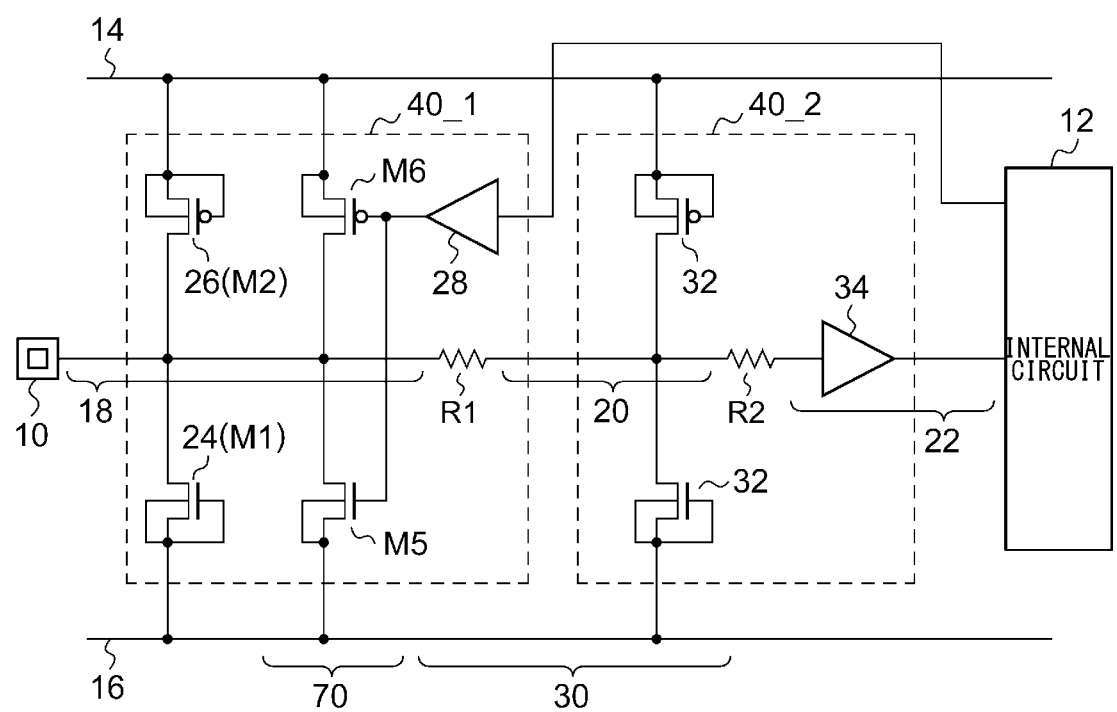
FIG. 5 is a circuit diagram showing a semiconductor integrated circuit according to a second modification.

FIG. 5 is a circuit diagram showing a configuration of the semiconductor integrated circuit 2b according to the second modification. The semiconductor integrated circuit 2b further includes an output buffer 70 and an output circuit 28 which allow a signal received from the internal circuit 12 to be output via the pad 10, in addition to the configuration of the semiconductor integrated circuit 2 shown in FIG. 1.

The output buffer 70 includes a fifth transistor M5 and a sixth transistor M6. The fifth transistor M5 has the same device structure as that of the first transistor M1. The fifth transistor M5 is arranged such that its drain is connected to the first line 18, its source and its back gate are connected to the ground line 16, and a signal received from the internal circuit 12 is input to its gate. The sixth transistor M6 has the same device structure as that of the second transistor M2. The sixth transistor M6 is arranged such that its drain is connected to the first line 18, its source and its back gate are connected to the power supply line 14, and a signal received from the internal circuit 12 is input to its gate.

Also, the output circuit 28 may be arranged between the internal circuit 12 and the gates of the fifth transistor M5 and the sixth transistor M6.

Preferably, the output buffer 70 and the output circuit 28 are each configured as an internal component of the standard cell 40_1. Specifically, in the layout diagram shown in FIG. 2B, a part of the N-channel MOSFET 42 is used as the first transistor M1. The other part of the N-channel MOSFET 42 is used as the fifth transistor M5 that forms the output buffer 70. Similarly, a part of the P-channel MOSFET 44 is used as the second transistor M2. The other part of the P-channel MOSFET 44 is used as the sixth transistor M6 that forms the output buffer 70.

On the other hand, the output circuit 28 is configured using the transistor element 48 formed in the standard cell 40_1.

It should be noted that, in the second modification, the whole of the N-channel MOSFETs 42 formed in the standard cell 40_1 may be configured as the fifth transistor M5. Also, the whole of the P-channel MOSFETs 44 may be configured as the sixth transistor M6.

With such a modification, the fifth transistor M5 and the sixth transistor M6, which are configured as the output buffer 70, provide a function as a path (ESD protection element) which allows an ESD surge to be released, as with the first transistor M1 and the second transistor M2. That is to say, with such an arrangement, by providing the output buffer 70, the ESD tolerance performance is not reduced, which is an advantage.

Third Modification

Figure 6:
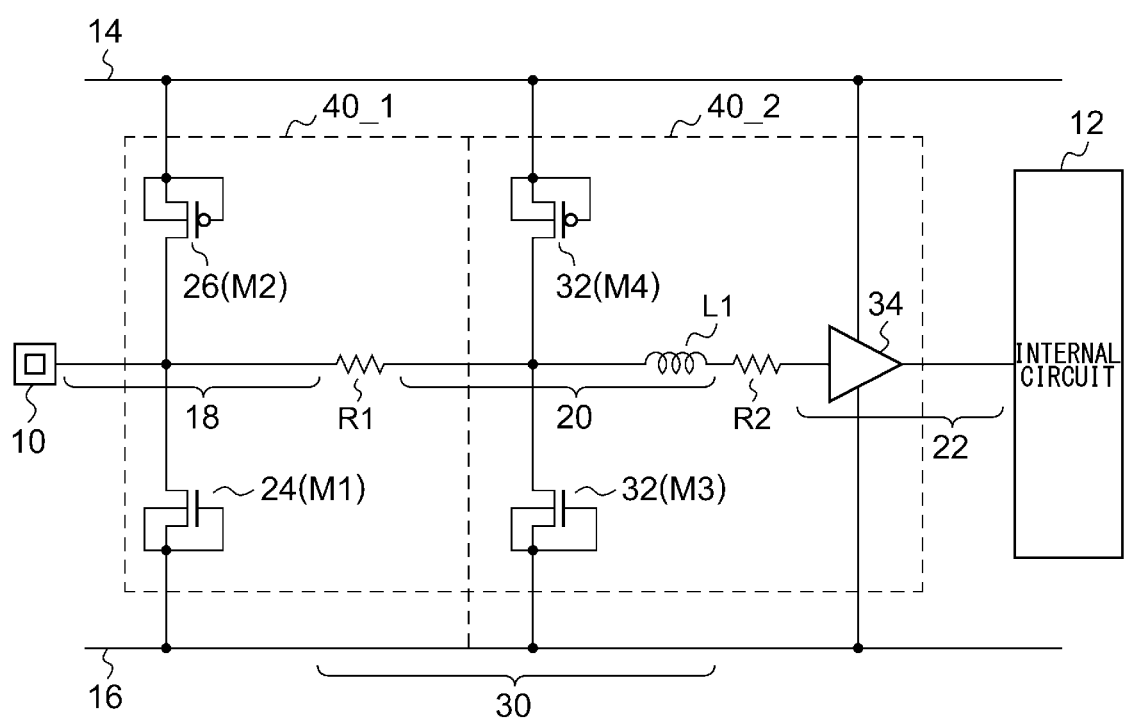
FIG. 6 is a circuit diagram showing a semiconductor integrated circuit according to a third modification.

FIG. 6 is a circuit diagram showing a semiconductor integrated circuit 2c according to a third modification. In the semiconductor integrated circuit 2c, a part of the second line 20 is configured to have an effective inductance 21. For example, a part of the second line 20 may be formed with a width narrower than that of the second line 20 shown in FIG. 2B in a tortuous form or otherwise in a spiral form, thereby providing the second line 20 with such an inductance 21.

Such a modification provides an RCL filter, which allows the filter pass band, delay time, and phase characteristics to be designed in a flexible manner, as compared with an RC filter.

Fourth Modification

Figure 7A:
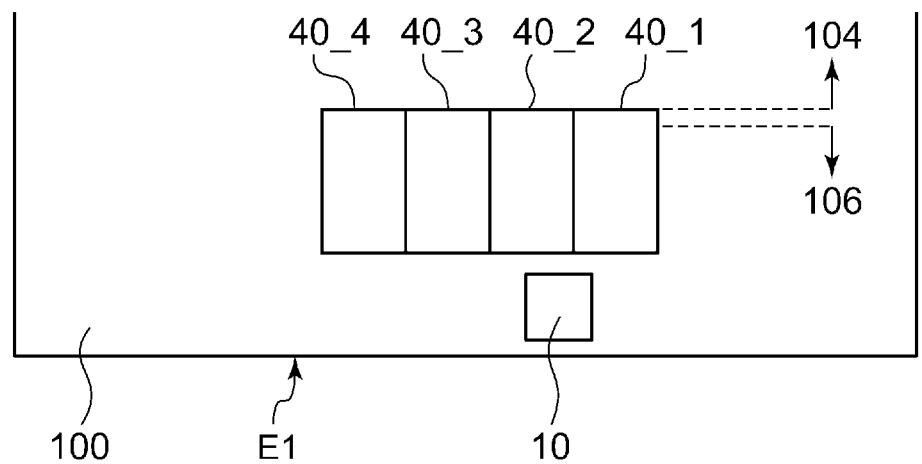
FIGS. 7A and 7B are a layout diagram and a circuit diagram showing a semiconductor integrated circuit according to a fourth modification.
Figure 7B:
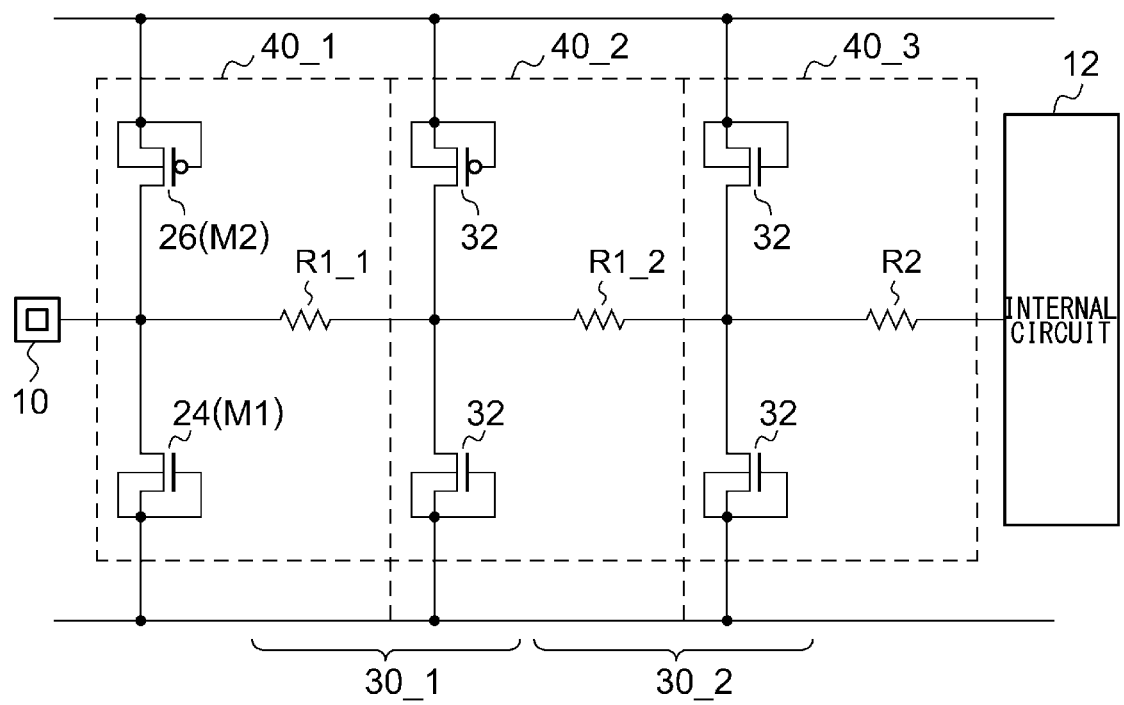

FIGS. 7A and 7B are a layout diagram and a circuit diagram showing a semiconductor integrated circuit 2d according to a fourth modification. Three or more standard cells 40 are arranged in the vicinity of the pad 10 in the I/O region 106 along an edge E1 of the semiconductor substrate 100.

Such an arrangement allows the designer of the semiconductor integrated circuit 2d to change the number of standard cells 40 to be used by changing the masks for the metal wiring and via holes. This allows the number of RC filter 30 stages to be changed, as shown in FIG. 7B. FIG. 7B shows an arrangement including three standard cells 40, and thus FIG. 7B shows an arrangement including the insertion of two RC filters 30. It should be noted that the input circuit 34 may be formed in any one of the standard cells 40_1 through 40_3. By changing the number of RC filter 30 stages, such an arrangement is capable of adjusting the controllable noise frequency to be removed over a wider range.

While the preferred embodiments of the present invention have been described using specific terms, such description is for illustrative purposes only, and it is to be understood that changes and variations may be made without departing from the spirit or scope of the appended claims.

What is claimed is:

1. A semiconductor integrated circuit comprising:
   a pad connected to receive an input signal having a high level or a low level;
   an internal circuit;
   a power supply line;
   a ground line;
   a filter resistor;
   a protection resistor;
   a first line that connects a first terminal of the filter resistor and the pad;
   a second line that connects a second terminal of the filter resistor and a first terminal of the protection resistor;
   a third line that connects a second terminal of the protection resistor and the internal circuit;
   a first protection element including a first transistor configured as an N-channel MOSFET (Metal Oxide Semiconductor Field Effect Transistor) designed so as to withstand ESD, wherein the first transistor has its drain connected to the first line, and has its source, its gate, and its back gate connected to the ground line;
   a second protection element including a second transistor configured as a P-channel MOSFET designed so as to withstand ESD, wherein the second transistor has its drain connected to the first line, and has its source, its gate, and its back gate connected to the power supply line; and
   a capacitance element coupled to the second line so as to form an RC filter together with the filter resistor, wherein the capacitance element includes at least one of a third transistor and a fourth transistor, and the third transistor is configured as an N-channel MOSFET having the same device structure as that of the first transistor, and the fourth transistor is configured as a P-channel MOSFET having the same device structure as that of the second transistor.

2. The semiconductor integrated circuit according to claim 1, wherein a set of the first transistor, the second transistor, and the filter resistor, and a set of the third transistor, the fourth transistor, and the protection resistor, are each configured as a standard cell including an N-channel MOSFET, a P-channel MOSFET, and a resistor device, arranged in a predetermined manner.

3. The semiconductor integrated circuit according to claim 2, wherein the P-channel MOSFET and the N-channel MOSFET each comprise a plurality of transistor elements, and are each configured to allow design modification of the transistor size to be made by changing metal wiring that connects the plurality of transistor elements.

4. The semiconductor integrated circuit according to claim 2, wherein the resistor device comprises a plurality of resistor elements, and is configured to allow design modification of the resistance value to be made by changing metal wiring.

5. The semiconductor integrated circuit according to claim 2, wherein the standard cell is arranged adjacent to the pad in an I/O region positioned in an outer circumference of a circuit area in which the internal circuit is arranged.

6. The semiconductor integrated circuit according to claim 5, wherein a plurality of standard cells is arranged along an edge of a semiconductor substrate, and wherein the N-channel MOSFET, the P-channel MOSFET, and the resistor device included in each one of the standard cells are laid out in a direction that is orthogonal to the aforementioned edge.

7. The semiconductor integrated circuit according to claim 6, wherein the ground line is formed along the aforementioned edge such that it overlaps the plurality of N-channel MOSFETs included in the plurality of standard cells, and wherein the power supply line is configured such that it overlaps the plurality of P-channel MOSFETs included in the plurality of standard cells.

8. The semiconductor integrated circuit according to claim 2, wherein three or more standard cells are each arranged adjacent to the pad in an I/O region positioned in an outer circumference of a circuit area in which the internal circuit is arranged.

9. The semiconductor integrated circuit according to claim 1, wherein the input signal has an edge in response to which the internal circuit operates.

10. The semiconductor integrated circuit according to claim 1, wherein the input signal is one from among a clock signal, a power-on reset signal, and a test signal.

11. The semiconductor integrated circuit according to claim 1, further comprising an output buffer configured to allow the internal circuit to output a signal via the pad, and wherein the output buffer comprises:

a fifth transistor having the same device structure as that of the first transistor, and arranged such that its drain is connected to the first line, its source and its back gate are connected to the ground line, and a signal output from the internal circuit is input to its gate; and a sixth transistor having the same device structure as that of the second transistor, and arranged such that its drain is connected to the first line, its source and its back gate are connected to the power supply line, and a signal output from the internal circuit is input to its gate.

12. The semiconductor integrated circuit according to claim 11, wherein a set of the first transistor, the second transistor, and the filter resistor, and a set of the third transistor, the fourth transistor, and the protection resistor are each configured as a standard cell comprising an N-channel MOSFET, a P-channel MOSFET, and a resistor device, arranged in a predetermined manner, and wherein the fifth transistor and the sixth transistor are each formed in the standard cell that corresponds to the set of the first transistor, the second transistor, and the filter resistor.

13. The semiconductor integrated circuit according to claim 1, wherein a part of the second line is configured to have an effective inductance.

14. The semiconductor integrated circuit according to claim 1, wherein the capacitance element is configured using a PN junction capacitance of at least one from among the third transistor and the fourth transistor.

15. The semiconductor integrated circuit according to claim 1, wherein the capacitance element is configured using a gate capacitance of at least one from among the third transistor and the fourth transistor.

16. The semiconductor integrated circuit according to claim 1, wherein two or more RC filters are arranged in series.

\* \* \* \* \*